United States Patent
Park et al.

(10) Patent No.: US 11,783,874 B2
(45) Date of Patent: Oct. 10, 2023

(54) MEMORY WITH SWAP MODE

(71) Applicant: SAMSUNG ELECTRONICS CO., LTD., Suwon-si (KR)

(72) Inventors: Taehyeon Park, Hwaseong-si (KR); Byunghoon Jeong, Hwaseong-si (KR); Chiweon Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/470,579

(22) Filed: Sep. 9, 2021

(65) Prior Publication Data

US 2022/0101893 A1     Mar. 31, 2022

(30) Foreign Application Priority Data

Sep. 29, 2020 (KR) .................. 10-2020-0127539
Jan. 25, 2021 (KR) .................. 10-2021-0010358

(51) Int. Cl.
*G11C 7/10* (2006.01)
*G11C 8/06* (2006.01)
*G11C 7/20* (2006.01)

(52) U.S. Cl.
CPC ............ *G11C 7/1012* (2013.01); *G11C 7/109* (2013.01); *G11C 7/1057* (2013.01); *G11C 7/1063* (2013.01); *G11C 7/1084* (2013.01); *G11C 7/20* (2013.01); *G11C 8/06* (2013.01)

(58) Field of Classification Search
CPC ... G11C 7/1012; G11C 7/1057; G11C 7/1063; G11C 7/1084; G11C 7/109; G11C 7/20; G11C 8/06
See application file for complete search history.

(56) References Cited

U.S. PATENT DOCUMENTS

| | | | |
|---|---|---|---|
| 7,752,383 B2 | 7/2010 | Cheng et al. | |
| 8,331,161 B2 | 12/2012 | Noh | |
| 8,644,084 B2 * | 2/2014 | Park .................... | G11C 7/1006 365/189.17 |
| 9,324,389 B2 | 4/2016 | Tam | |
| 9,805,769 B2 | 10/2017 | Lee et al. | |
| 10,074,632 B2 | 9/2018 | Song et al. | |
| 10,679,956 B2 | 6/2020 | Kim et al. | |
| 10,802,532 B2 * | 10/2020 | Vergis .................... | H01L 24/00 |
| 2013/0329390 A1 | 12/2013 | Shin et al. | |

* cited by examiner

*Primary Examiner* — Vanthu T Nguyen
(74) *Attorney, Agent, or Firm* — F. Chau & Associates, LLC

(57) ABSTRACT

A memory chip, a memory controller, and an operating method of the memory chip are provided. The memory chip includes a plurality of pins; and an interface circuit configured to receive a swap command set from a memory controller through the plurality of pins, obtain a swap command and a swap address from the swap command set, generate a swap enable signal based on the swap command and the swap address, and swap and output a data signal according to the swap enable signal.

10 Claims, 18 Drawing Sheets

FIG. 7

| CMD_SWAP/<br>ADDR_SWAP | DQ[0] | DQ[1] | DQ[2] | DQ[3] | DQ[4] | DQ[5] | DQ[6] | DQ[7] |
|---|---|---|---|---|---|---|---|---|
| 00 | 0 | 0 | 0 | 0 | 0 | 0 | 0 | 0 |
| 18 | 0 | 0 | 0 | 1 | 1 | 0 | 0 | 0 |
| 24 | 0 | 0 | 1 | 0 | 0 | 1 | 0 | 0 |
| 3C | 0 | 0 | 1 | 1 | 1 | 1 | 0 | 0 |
| 42 | 0 | 1 | 0 | 0 | 0 | 0 | 1 | 0 |
| 5A | 0 | 1 | 0 | 1 | 1 | 0 | 1 | 0 |
| 66 | 0 | 1 | 1 | 0 | 0 | 1 | 1 | 0 |
| 7E | 0 | 1 | 1 | 1 | 1 | 1 | 1 | 0 |
| 81 | 1 | 0 | 0 | 0 | 0 | 0 | 0 | 1 |
| 99 | 1 | 0 | 0 | 1 | 1 | 0 | 0 | 1 |
| A5 | 1 | 0 | 1 | 0 | 0 | 1 | 0 | 1 |
| BD | 1 | 0 | 1 | 1 | 1 | 1 | 0 | 1 |
| C3 | 1 | 1 | 0 | 0 | 0 | 0 | 1 | 1 |
| DB | 1 | 1 | 0 | 1 | 1 | 0 | 1 | 1 |
| E7 | 1 | 1 | 1 | 0 | 0 | 1 | 1 | 1 |
| FF | 1 | 1 | 1 | 1 | 1 | 1 | 1 | 1 |

14

MEMORY WITH SWAP MODE

CROSS-REFERENCE TO RELATED APPLICATIONS

This application claims priority under 35 U.S.C. § 119 to Korean Patent Application Nos. 10-2020-0127539 and 10-2021-0010358, filed on Sep. 29, 2020 and Jan. 25, 2021, respectively, in the Korean Intellectual Property Office, the disclosures of which are incorporated by reference herein in their entireties.

FIELD

The present disclosure relates to semiconductor memory devices, and more particularly relates to a memory chip, a memory controller, and an operating method of the memory chip.

DISCUSSION OF RELATED ART

When a plurality of chips are mounted on a double-layer printed circuit board (PCB), and when channel lengths of a front chip and a rear chip increase, interference between wirings may increase and signal integrity (SI) may be degraded.

To reduce the length of a stub and facilitate routing, the rear chip may be mounted using a mirror method. The front chip may determine whether a connected chip is a rear chip mounted using a mirror method or another chip located in the front. A separate pin may be additionally allocated to each chip for such determination, which, in turn, may increase the chip size.

SUMMARY

The present disclosure provides a memory chip that identifies whether a connected chip is set to a correct swap mode based on a command and an address without allocating a separate pin, and controls a swap mode of the chip based on results of identification. The present disclosure also provides a memory controller, and an operating method of the memory chip.

According to an embodiment of the present disclosure, there is provided a memory chip includes a plurality of pins; and an interface circuit configured to receive a swap command set from a memory controller through the plurality of pins, obtain a swap command and a swap address from the swap command set, generate a swap enable signal based on the swap command and the swap address, and swap and output a data signal according to the swap enable signal.

According to an embodiment of the present disclosure, there is provided a memory controller connected to a chip, wherein the memory controller is configured to transmit a status check command to the chip, and receive a first value from the chip as a response to the status check command, when the first value is the same as a second value stored in a register of the chip, determine a swap mode of the chip as a first state, and when the first value is a value obtained by swapping the second value, determine the swap mode of the chip as a second state.

According to an embodiment of the present disclosure, there is provided an operating method of a memory chip including a plurality of pins including receiving a swap command set through the plurality of pins; obtaining a swap command and a swap address from the swap command set; generating a swap enable signal based on the swap command and the swap address; and swapping and outputting a data signal through the plurality of pins according to the swap enable signal.

BRIEF DESCRIPTION OF THE DRAWINGS

Embodiments of the present disclosure will be more clearly understood from the following detailed description when taken in conjunction with the accompanying drawings, in which:

FIG. 7 is a tabular diagram illustrating a swap command and a swap address according to an embodiment of the present disclosure;

DETAILED DESCRIPTION

Hereinafter, embodiments of the present disclosure will be described in detail with reference to the accompanying drawings. The present disclosure is made by way of example with respect to the described embodiments, but is not particularly limited thereto.

Figure 1:
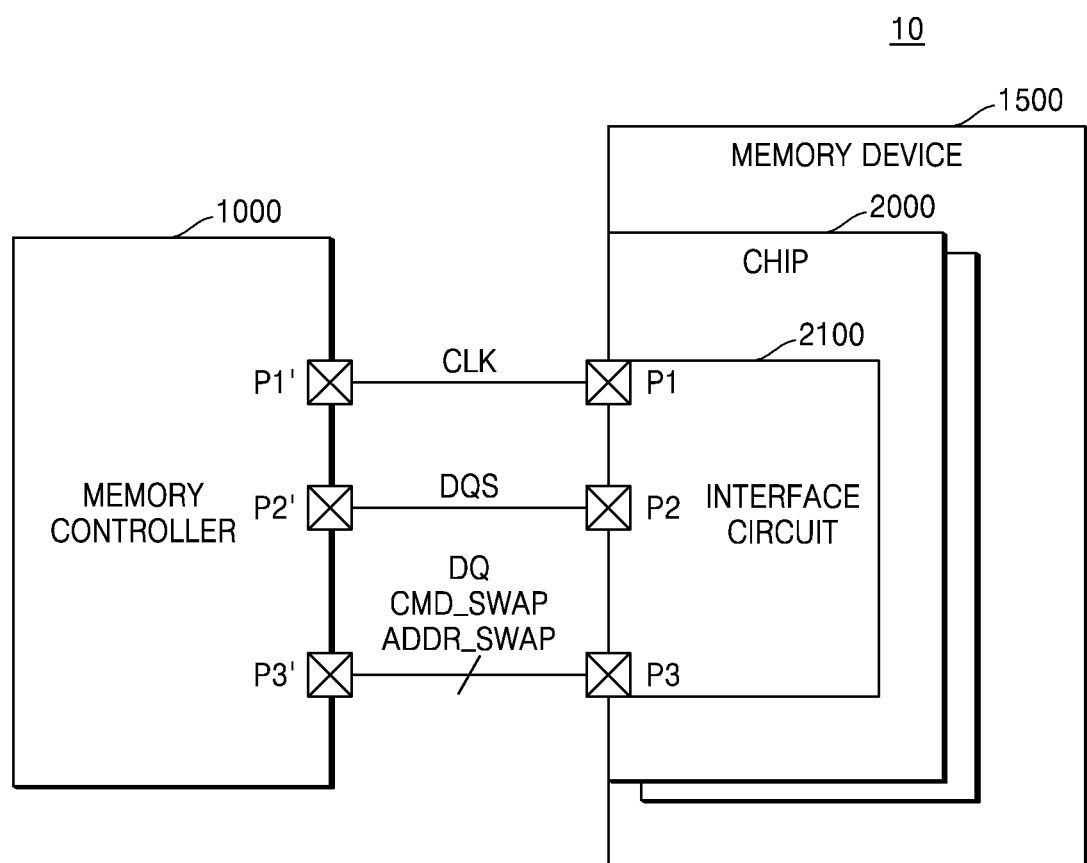
FIG. 1 is a block diagram illustrating a storage device according to an embodiment of the present disclosure.

FIG. 1 illustrates a storage device 10 according to an embodiment of the present disclosure.

Referring to FIG. 1, the storage device 10 may include a memory controller 1000 and a memory device 1500. The memory device 1500 may be a nonvolatile memory device and may include a plurality of chips 2000.

In an embodiment, each of the plurality of chips 2000 may correspond to a memory chip and may include an interface circuit. As an example, at least one of the plurality of chips 2000 may correspond to a buffer chip disposed between the memory controller 1000 and the memory device 1500. Hereinafter, for convenience of description, it is assumed that each of the plurality of chips 2000 is a memory chip, but the present disclosure is not limited thereto.

In an embodiment, the memory controller 1000 may be referred to as a memory controller chip or a controller chip, but is not limited thereto.

Because the memory device 1500 includes a plurality of memory chips 2000, the memory device 1500 may be referred to as a 'multi-chip memory'. For example, each of the plurality of memory chips 2000 may be a Dual Die Package (DDP), a Quadruple Die Package (QDP), or an Octuple Die Package (ODP). However, the present disclosure is not limited thereto, and in some embodiments, a plurality of memory chips 2000 may correspond to a plurality of memory dies, respectively, and accordingly, the memory device 1500 may be referred to as a 'multi-die package'.

In an embodiment, each of the plurality of memory chips 2000 may be a nonvolatile memory chip. For example, each of the plurality of memory chips 2000 may be a NAND flash memory chip. For example, at least one of the plurality of memory chips 2000 may be a vertical NAND (VNAND) flash memory chip, and the vertical NAND flash memory chip may include cell strings respectively including word lines stacked on a substrate in a vertical direction and a plurality of memory cells respectively connected to the word lines. However, the present disclosure is not limited thereto, and at least one of the plurality of memory chips 2000 may be a resistive memory chip such as resistive RAM (ReRAM), phase change RAM (PRAM), and/or magnetic RAM (MRAM).

The memory controller 1000 and each of the plurality of chips 2000 may communicate with each other through a plurality of signal lines including a clock signal line, input/output signal lines, and a data strobe signal line. For example, the memory controller 1000 and each of the plurality of chips 2000 may be implemented to comply with a standard specification such as a toggle or Open NAND Flash Interface (ONFI).

The memory controller 1000 may transmit a clock signal CLK to the memory device 1500 through the clock signal line. In the present embodiment, the clock signal CLK may be toggled to a predetermined frequency in a specific period, and accordingly, the storage device 10 may be referred to as an asynchronous system, without limitation thereto. For example, the clock signal CLK may be toggled at a frequency corresponding to a data input/output speed.

The memory controller 1000 may transmit commands and addresses to the memory device 1500 through input/output signal lines, and data signal DQ may be transmitted between the memory controller 1000 and the memory device 1500 through input/output signal lines. In addition, a data strobe signal DQS may be transmitted between the memory controller 1000 and the memory device 1500 through the data strobe signal line. In this case, signal lines through which the clock signal CLK, the data signal DQ, and the data strobe signal DQS are transmitted and received may constitute a channel.

The memory device 1500 may include an interface circuit 2100, a clock pin P1 connected to the clock signal line, a data strobe pin P2 connected to the data strobe signal line, and input/output pins P3 respectively connected to the input/output signal lines. The plurality of chips 2000 may be connected in common to each of the clock pin P1, the data strobe pin P2, and the input/output pins P3.

The memory controller 1000 may include a clock pin P1', a data strobe pin P2', and input/output pins P3' respectively connected to the clock pin P1, the data strobe pin P2, and the input/output pins P3. As an example, the input/output pins P3 or P3' may each include 8 input/output pins, but the present disclosure is not limited thereto.

In an embodiment, the memory device 1500 may include a substrate and the plurality of chips 2000. Each of the plurality of chips 2000 may be vertically stacked on the substrate. The input/output pins P3 may be disposed on the substrate, and input/output nodes of the plurality of chips 2000 may be respectively connected to the input/output pins P3. For example, the input/output pins P3 and the input/output nodes may be connected to each other by wire bonding. For such wire bonding, the plurality of chips 2000 may be stacked with a skew in a horizontal direction.

The input/output pins P3' of the memory controller 1000 may be plural, and the input/output pins P3 of the memory device 1500 may also be plural. Meanwhile, data may be transmitted and received between the memory controller 1000 and the memory device 1500 through the input/output pins P3' and P3, and the input/output pins P3' and P3 may be connected in various ways.

According to the present embodiment, the memory controller 1000 may transmit a swap command set SWAP CMD SET including a swap command CMD_SWAP and a swap address ADDR_SWAP through the data signal DQ transmitted to the plurality of chips 2000. Each of the plurality of chips 2000 may receive the data signal DQ as it is or may swap and receive the data signal DQ based on the swap command set SWAP CMD SET. In addition, each of the plurality of chips 2000 may output the data signal DQ as it is or may swap and output the data signal DQ based on the swap command set SWAP CMD SET.

Figure 2:
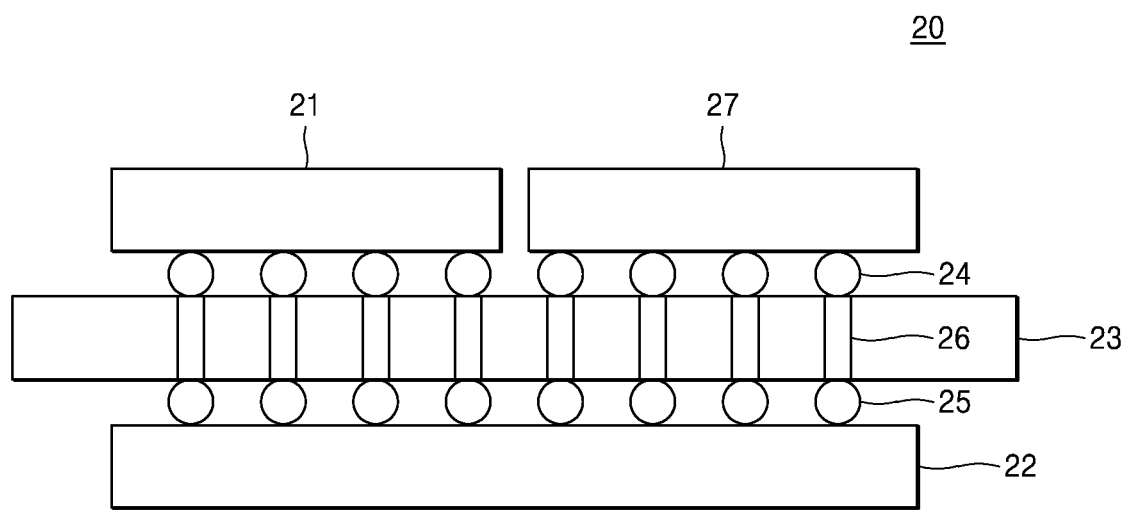
FIG. 2 is a cross-sectional diagram illustrating a semiconductor package according to an embodiment of the present disclosure.
Figure 3A:
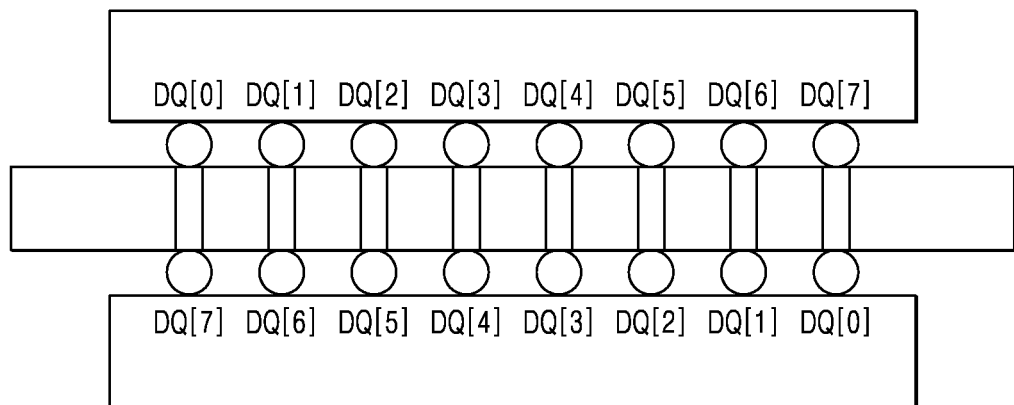
FIGS. 3A and 3B are cross-sectional diagrams illustrating semiconductor packages according to embodiments of the present disclosure.
Figure 3B:
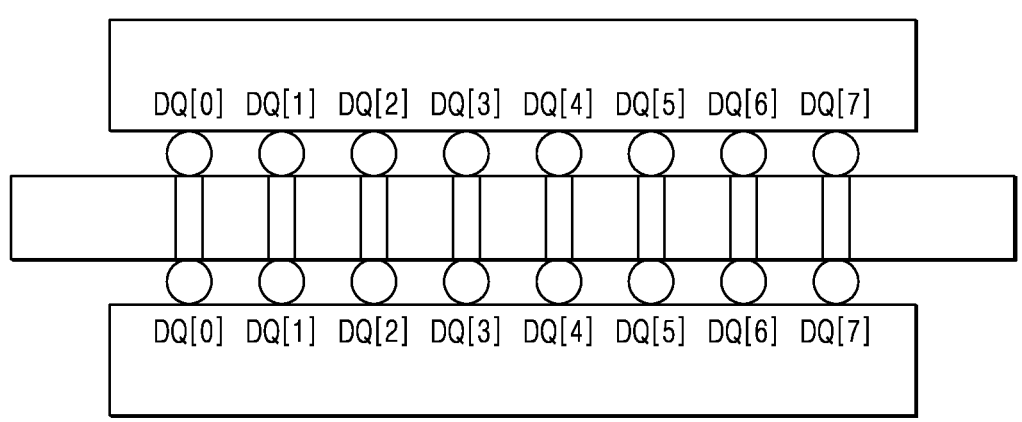

FIG. 2 illustrates a semiconductor package 20 according to an embodiment of the present disclosure, and FIGS. 3A and 3B illustrate semiconductor packages according to embodiments of the present disclosure.

Referring to FIG. 2, the semiconductor package 20 may include a first semiconductor chip 21, a second semiconductor chip 22, and a third semiconductor chip 27. The first semiconductor chip 21 and the third semiconductor chip 27 may be connected to a substrate 23 through connection terminals 24, and the second semiconductor chip 22 may be connected to the substrate 23 through connection terminals 25. A method of mounting the first semiconductor chip 21, the second semiconductor chip 22, and the third semiconductor chip 27 on the substrate 23 is not limited.

According to an embodiment, the substrate 23 may be a single-layer Printed Circuit Board (PCB) in which wiring is formed on one side of the board or a double-layer PCB in which wiring is formed on both sides of the board. In the present specification, a case in which the first semiconductor chip 21, the second semiconductor chip 22, and the third semiconductor chip 27 are mounted on a double-layer PCB will be described.

The substrate 23 may include a plurality of via holes 26 penetrating through the substrate 23, and a wiring in an upper portion of the substrate 23 may be connected to a wiring in a lower portion of the substrate 23 through conductive vias formed in the via holes 26.

As an example, the wiring in the upper portion of the substrate 23 may be connected to the wiring in the lower portion of the substrate 23 using a mirror method. The mirror method may refer to a method of connecting an upper semiconductor chip to a lower semiconductor chip to face each other. Accordingly, the semiconductor package 20 may be implemented as a mirror-die package (MDP).

The first, second, and third semiconductor chips 21, 22, and 27 may include a memory controller (e.g., 1000 in FIG. 1) and/or a memory device (e.g., 1500 in FIG. 1). In an embodiment, the first semiconductor chip 21 may include the memory controller 1000, and the second semiconductor chip 22 or the third semiconductor chip 27 may include the memory device 1500.

That is, the memory controller 1000 and the memory device 1500 may be mounted on the same surface or may be mounted to face each other up and down, (e.g., top-and-bottom). In the above example, the first semiconductor chip 21 may be attached to a front surface of the substrate 23, and the second semiconductor chip 22 may be attached to a rear surface of the substrate 23.

The first semiconductor chip 21 and the third semiconductor chip 27 may be connected to each other using a normal method so that input/output pins of the first semiconductor chip 21 and input/output pins of the third semiconductor chip 27 may be connected to each other in a forward direction.

However, because the first semiconductor chip 21 and the second semiconductor chip 22 may be connected to each other using the mirror method, the input/output pins of the first semiconductor chip 21 and the input/output pins of the second semiconductor chip 22 may be swapped when actively connected to each other.

Referring to FIGS. 3A and 3B together, reference numeral 20a denotes an arrangement of input/output pins before the lower second semiconductor chip 22 is swapped, and reference numeral 20b denotes an arrangement of input/output pins after the lower second semiconductor chip 22 is swapped.

In the case of reference numeral 20a, the input/output pins of the second semiconductor chip 22 are arranged (e.g., least significant bit DQ[0] to most significant bit DQ[7]) from right to left, and in the case of reference numeral 20b, the input/output pins of the second semiconductor chip 22 are arranged from left to right through a swap operation so that the input/output pins of the second semiconductor chip 22 may be in the same direction as those of the upper first semiconductor chip 21.

Hereinafter, an operation of swapping the arrangement of input/output pins may be referred to as an operation of changing a swap mode of a semiconductor chip.

According to an embodiment of the present disclosure, the swap mode of the semiconductor chip may be changed using data transmitted and received through the input/output pins without using a separate pin for changing the swap mode to swap the arrangement of the input/output pins of the semiconductor chip. For example, the semiconductor chip may change the swap mode by receiving a command and an address for setting the swap mode.

A separate pin in comparative examples may be referred to as a swap mode pin. According to an embodiment of the present disclosure, the semiconductor chip does not include a swap mode pin, and thus the size of the semiconductor chip may be reduced. An operation of performing a swap operation using a swap mode pin may be referred to as a pin-type swap mode, and an operation of performing a swap operation using a command and an address for setting the swap mode may be referred to as a command-type swap mode.

Figure 4:
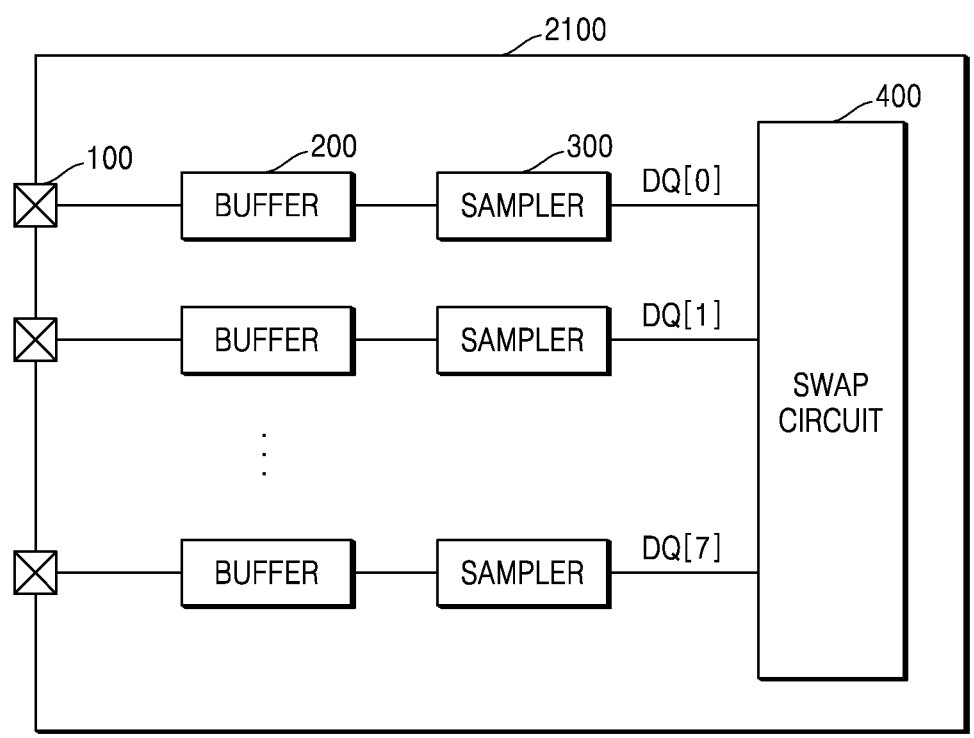
FIG. 4 is a block diagram illustrating an interface circuit according to an embodiment of the present disclosure.

FIG. 4 illustrates an interface circuit 2100 according to an embodiment of the present disclosure.

Referring to FIG. 4, the interface circuit 2100 may be included in the plurality of chips 2000 of FIG. 1. For convenience of explanation, it is assumed that each of the plurality of chips 2000 is a memory chip. The interface circuit 2100 may include a plurality of input/output pins 100, a plurality of buffers 200, a plurality of samplers 300, and a swap circuit 400. Although not shown, the interface circuit 2100 may further include a clock pin and a data strobe pin. In FIG. 4, although it is assumed that the number of input/output pins is eight (8) for this example, the present disclosure is not limited thereto.

In an embodiment, the interface circuit 2100 may receive 8 bits of data. Data received through the plurality of input/output pins 100 may be input to the swap circuit 400 through the plurality of buffers 200 and the plurality of samplers 300. A function of a sampler may be determined according to the type of data and/or the input/output speed.

When 8-bit signals DQ[0] to DQ[7] passing through the plurality of samplers 300 are input to the swap circuit 400, the swap circuit 400 may output the data signals DQ[0] to DQ[7] as they are or swap and output the data signals DQ[7] to DQ[0] according to the swap mode. The swap mode of the swap circuit 400 may set by the swap command set (for example, SWAP CMD SET in FIG. 1). An operation of swapping data may mean an operation of rearranging data initially arranged in the order of the first data signal DQ[0] to the eighth data signal DQ[7] into the order of the eighth data signal DQ[7] to the first data signal DQ[0], respectively.

As an example, a case where the input data signal DQ is 00001010 in binary (i.e., 0A in hexadecimal) will be described. When the swap mode of the memory chip 2000 is OFF, the swap circuit 400 may output the input data signal as it is, and the output data may be 00001010 in binary (i.e., 0A in hexadecimal). When the swap mode of the memory chip 2000 is ON, the swap circuit 400 may swap and output the input data signal, and the output data may be 01010000 in binary (i.e., 50 in hexadecimal).

Figure 5:
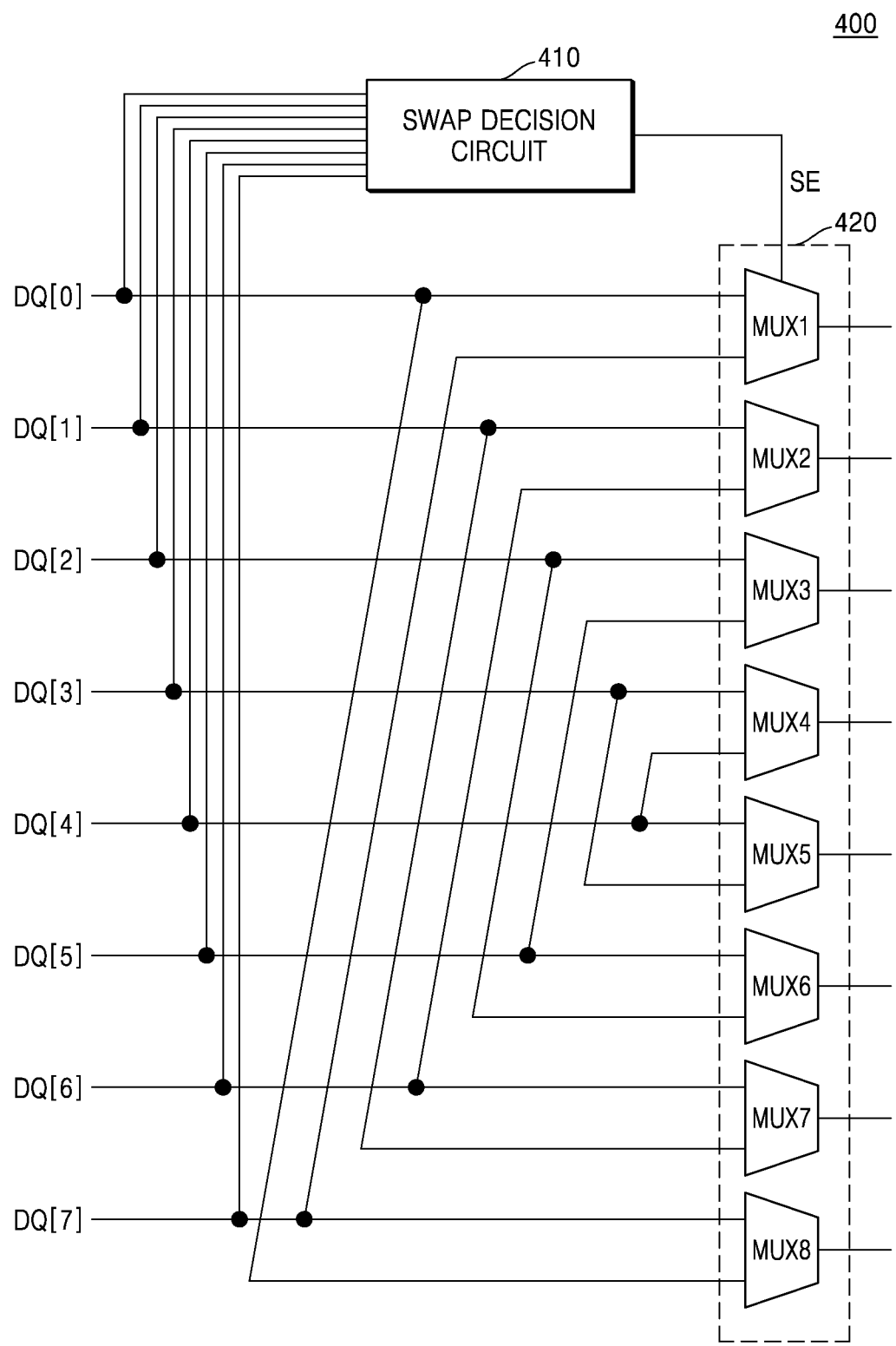
FIG. 5 is a circuit diagram illustrating a swap circuit according to an embodiment of the present disclosure.

FIG. 5 illustrates the swap circuit 400 according to an embodiment of the present disclosure.

Referring to FIG. 5, the swap circuit 400 may include a swap decision circuit 410 and a plurality of multiplexers 420.

The swap decision circuit 410 may receive the first to eighth data signals DQ[0] to DQ[7], such as via a multiplexed and/or multi-conductor bridge, generate a swap enable signal SE, and output the swap enable signal SE to the plurality of multiplexers 420. The swap enable signal SE may serve as a selection signal for each of the multiplexers 420.

The swap decision circuit 410 may receive the first to eighth data signals DQ[0] to DQ[7], and determine whether an arrangement of the first to eighth data signals DQ[0] to DQ[7] includes a swap command set.

The swap command set may include a swap command and a swap address. The swap command may set up the swap decision circuit 410 to change a swap mode of the memory chip (for example, 2000 in FIG. 1), and the swap address may change the swap mode of the memory chip 2000, and thus, it may be determined whether to swap a data signal which is input after the swap mode is set.

When the arrangement of the first to eighth data signals DQ[0] to DQ[7] includes the swap command, the swap decision circuit 410 may perform a preparation operation for generating the swap enable signal SE. That is, the swap decision circuit 410 may perform a series of operations for setting up an interface circuit (e.g., 2100 of FIG. 1) to change the swap mode of the memory chip 2000. In addition, the swap decision circuit 410 may perform the preparation operation to receive a swap address to be input.

When the arrangement of the first to eighth data signals DQ[0] to DQ[7] includes the swap address, the swap decision circuit 410 may generate the swap enable signal SE according to the swap address, and determine a logic level of the swap enable signal SE.

As an example, when the swap address indicates a swap mode ON state of the memory chip 2000, the swap decision circuit 410 may output the swap enable signal SE of a first logic level (e.g., logic high). As an example, when the swap address indicates a swap mode OFF state of the memory chip 2000, the swap decision circuit 410 may output the swap enable signal SE of a second logic level (e.g., logic low).

Each of the plurality of multiplexers 420 may receive two signals of the first to eighth data signals DQ[0] to DQ[7], and select as output either one of the two signals according to the swap enable signal SE output by the swap decision circuit 410.

As an example, a first multiplexer MUX1 may receive the first data signal DQ[0] and the eighth data signal DQ[7], a second multiplexer MUX2 may receive the second data signal DQ[1] and the seventh data signal DQ[6], a third multiplexer MUX3 may receive the third data signal DQ[2] and the sixth data signal DQ[5], a fourth multiplexer MUX4 may receive the fourth data signal DQ[3] and the fifth data signal DQ[4], a fifth multiplexer MUX5 may receive the fifth data signal DQ[4] and the fourth data signal DQ[3], a sixth multiplexer MUX6 may receive the sixth data signal DQ[5] and the third data signal DQ[2], a seventh multiplexer MUX7 may receive the seventh data signal DQ[6] and the second data signal DQ[1], and an eighth multiplexer MUX8 may receive the eighth data signal DQ[7] and the first data signal DQ[0].

As an example, when the swap enable signal SE is at a first logic level, the first to eighth multiplexers MUX1 to MUX8 may respectively output the first to eighth data signals DQ[0] to DQ[7]. When the swap enable signal SE is at a second logic level, the first multiplexer to the eighth multiplexer MUX1 to MUX8 may respectively output the eighth data signal to the first data signal DQ[7] to DQ[0]. Accordingly, the swap circuit 400 may perform the swap operation.

In an alternate embodiment, the signal lines corresponding to the data signal DQ of FIG. 5 may be rearranged, top to bottom with respect to the circuit diagram, from DQ[0], DQ[1], DQ[2], DQ[3], DQ[4], DQ[5], DQ[6], DQ[7], into DQ[0], DQ[7], DQ[1], DQ[6], DQ[2], DQ[5], DQ[3], DQ[4], for example. This alternate embodiment may provide substantially same length conductive paths for the data signals input to the multiplexers regardless of swap mode.

Figure 6:
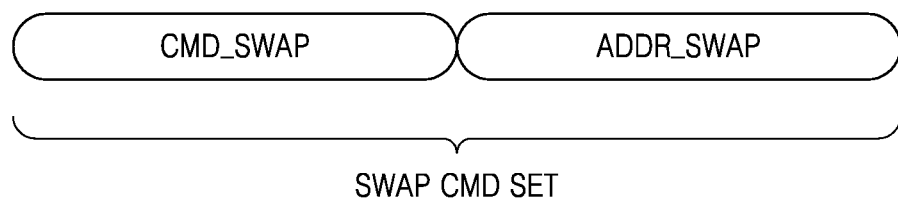
FIG. 6 is a conceptual diagram illustrating a swap command set according to an embodiment of the present disclosure.

FIG. 6 illustrates the swap command set SWAP CMD SET according to an embodiment of the present disclosure.

Referring to FIG. 6, the swap command set SWAP CMD SET may include the swap command CMD_SWAP and the swap address ADDR_SWAP. The swap command set SWAP CMD SET may be generated by a memory controller and transmitted to a memory chip. For example, the swap command CMD_SWAP may be transmitted first, and then the swap address ADDR_SWAP may be sequentially transmitted, without limitation thereto.

Accordingly, the memory chip may perform various preparation operations to determine that a signal subsequently received after receiving the swap command CMD_SWAP is the swap address ADDR_SWAP for changing a swap mode.

The swap address ADDR_SWAP transmitted after the swap command CMD_SWAP may include signals indicating various swap operations. As an example, the swap address ADDR_SWAP may include at least one of a signal to turn on the swap mode of the memory chip, a signal to turn OFF the swap mode of the memory chip, a signal to operate the memory chip in a pin-type swap mode, and a signal to operate the memory chip in a command-type swap mode, but is not limited thereto.

According to the present embodiment, the swap command CMD_SWAP and the swap address ADDR_SWAP may be configured as a pair to indicate the swap operation. Accordingly, compared to a comparative case example in which the swap operation is performed with just a single command, the possibility may be reduced that the memory chip may malfunction or swap command may be recognized as an invalid command in an actual use environment.

FIG. 7 illustrates the swap command CMD_SWAP and the swap address ADDR_SWAP according to an embodiment of the present disclosure.

Referring to FIGS. 6 and 7 together, the swap command CMD_SWAP and the swap address ADDR_SWAP may each include palindromes. A palindrome is a number that remains the same when its digits are reversed.

According to the present embodiment, the swap command CMD_SWAP and the swap address ADDR_SWAP may indicate the same operation regardless of whether a memory chip (for example, 2000 in FIG. 1) and a memory controller (for example, 1000 in FIG. 1) are connected to each other using a mirror method or not. When a value changes depending on whether or not the mirror method is used, the value is not used as a swap command CMD_SWAP.

Therefore, when the swap command CMD_SWAP is used as a first value other than a palindrome, a second value to which the first value is swapped may not be used as a separate command. That is, when the swap command CMD_SWAP includes the first value other than a palindrome, two values are assigned to a same command for the swap operation. According to the present embodiment, consumption of command and address signals may be reduced by using the swap command CMD_SWAP and the swap address ADDR_SWAP including palindromes.

Hereinafter, 8-bit data will be described as an example, but the present disclosure is not limited thereto. For convenience of explanation, "h" is added after a number to indicate a hexadecimal number.

A palindrome including 8 bits may include 00h, 18h, 24h, 3Ch, 42h, 5Ah, 66h, 7Eh, 81h, 99h, A5h, BDh, C3h, DBh, E7h and FFh. For example, A5h is 10100101 in binary representation. The reversed binary digits are also 10100101, and thus A5h is a palindrome in binary representation.

The swap command CMD_SWAP and the swap address ADDR_SWAP may include any one of the above palindromes, or others for bit lengths different than 8-bit. In an embodiment, the swap command may be 7Eh, and the swap address ADDR_SWAP for turning on the swap mode of the memory chip 2000 may be 42h.

Figure 8:
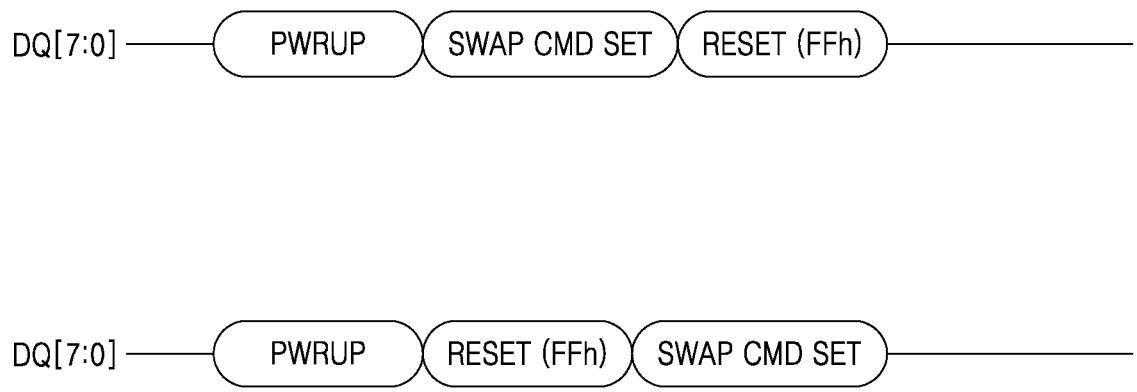
FIG. 8 is a timing diagram illustrating a swap command set according to an embodiment of the present disclosure.

FIG. 8 illustrates the swap command set SWAP CMD SET according to an embodiment of the present disclosure.

Referring to FIGS. 1 and 8 together, the memory controller 1000 may transmit a power-up command PWRUP and a reset command (e.g., FFh) to the memory chip 2000, and the memory chip 2000 may perform a power-up operation and a reset operation according to each command.

The memory controller 1000 may transmit the swap command set SWAP CMD SET to the memory chip 2000 between a time when the power up command PWRUP is transmitted and a time when the reset command is transmitted. In this regard, the memory chip 2000 may perform a swap operation after the power-up operation, and then perform the reset operation.

In addition, when the reset command includes a palindrome, the memory controller 1000 may transmit the power-up command PWRUP, and then transmit the swap command set SWAP CMD SET to the memory chip 2000 after transmitting the reset command. This is because, for example, when the reset command is FFh which is a palindrome, the memory chip 2000 may perform the reset operation regardless of whether the memory chip 2000 and the memory controller 1000 are connected to each other using a mirror method.

Figure 9:
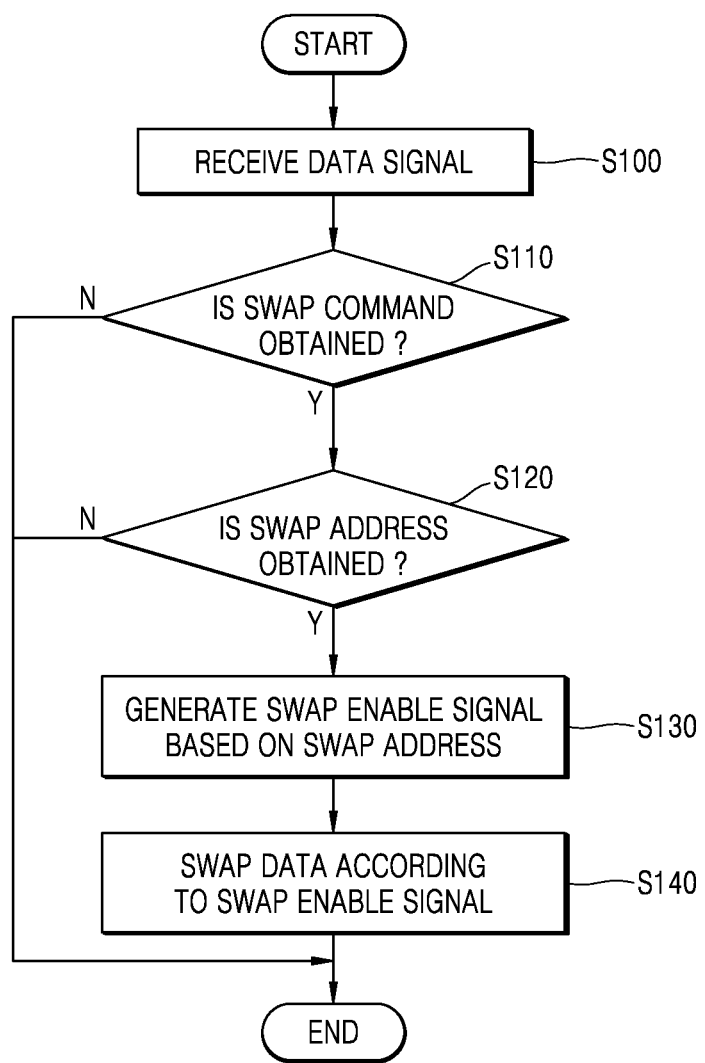
FIG. 9 is a flowchart illustrating an operation of a memory chip according to an embodiment of the present disclosure.

FIG. 9 illustrates an operation of the memory chip 2000 according to an embodiment of the present disclosure.

Referring to FIGS. 1 and 9 together, an operation of receiving a data signal may be performed (S100). As an example, the memory chip 2000 may receive the data signal DQ from the memory controller 1000 through the input/output pins P3.

An operation of determining whether the swap command CMD_SWAP is obtained may be performed (S110). As an example, the memory chip 2000 may obtain a signal corresponding to the swap command CMD_SWAP by decoding data included in the data signal DQ. Because the swap command CMD_SWAP includes a palindrome, the memory chip 2000 may select a palindrome included in the data signal DQ as an example, and determine whether the palindrome corresponds to the swap command CMD_SWAP.

When the swap command CMD_SWAP is obtained from data signal DQ, an operation of determining whether the swap address ADDR_SWAP is obtained may be performed (S120). When the memory chip 2000 receives the swap command set SWAP CMD SET from the memory controller 1000, the swap command CMD_SWAP and the swap address ADDR_SWAP may be obtained from the swap command set SWAP CMD SET.

As an example, the swap address ADDR_SWAP may be transmitted after transmission of the swap command CMD_SWAP.

Because the swap address ADDR_SWAP includes a palindrome, the memory chip 2000 may select the palindrome included in the data signal DQ as an example, and determine whether the palindrome corresponds to the swap address ADDR_SWAP.

An operation of generating the swap enable signal SE based on the swap address ADDR_SWAP may be performed (S130). As an example, the swap decision circuit (e.g., 410 of FIG. 5) of the memory chip 2000 may determine a logic level of the swap enable signal SE according to the swap address ADDR_SWAP.

For example, when the swap address ADDR_SWAP corresponds to a signal to turn on the swap mode of the memory chip 2000, the swap decision circuit may determine the logic level of the swap enable signal SE to be logic high, and when the swap address ADDR_SWAP corresponds to a signal to turn OFF the swap mode of the memory chip 2000, the swap decision circuit may determine the logic level of the swap enable signal SE to be logic low. An operation of swapping data may be performed according to the swap enable signal SE (S140). As an example, a plurality of multiplexers (for example, 420 of FIG. 5) of the memory chip 2000 may output the data signal DQ as it is or may swap and output the data signal DQ according to the swap enable signal SE. The output data may be transmitted to a memory cell array through a control logic circuit or a page buffer of the memory chip 2000. The data signal DQ may mean the data signal DQ received in step S100 including the swap command set SWAP CMD SET or the data signal DQ received after step S140.

Figure 10:
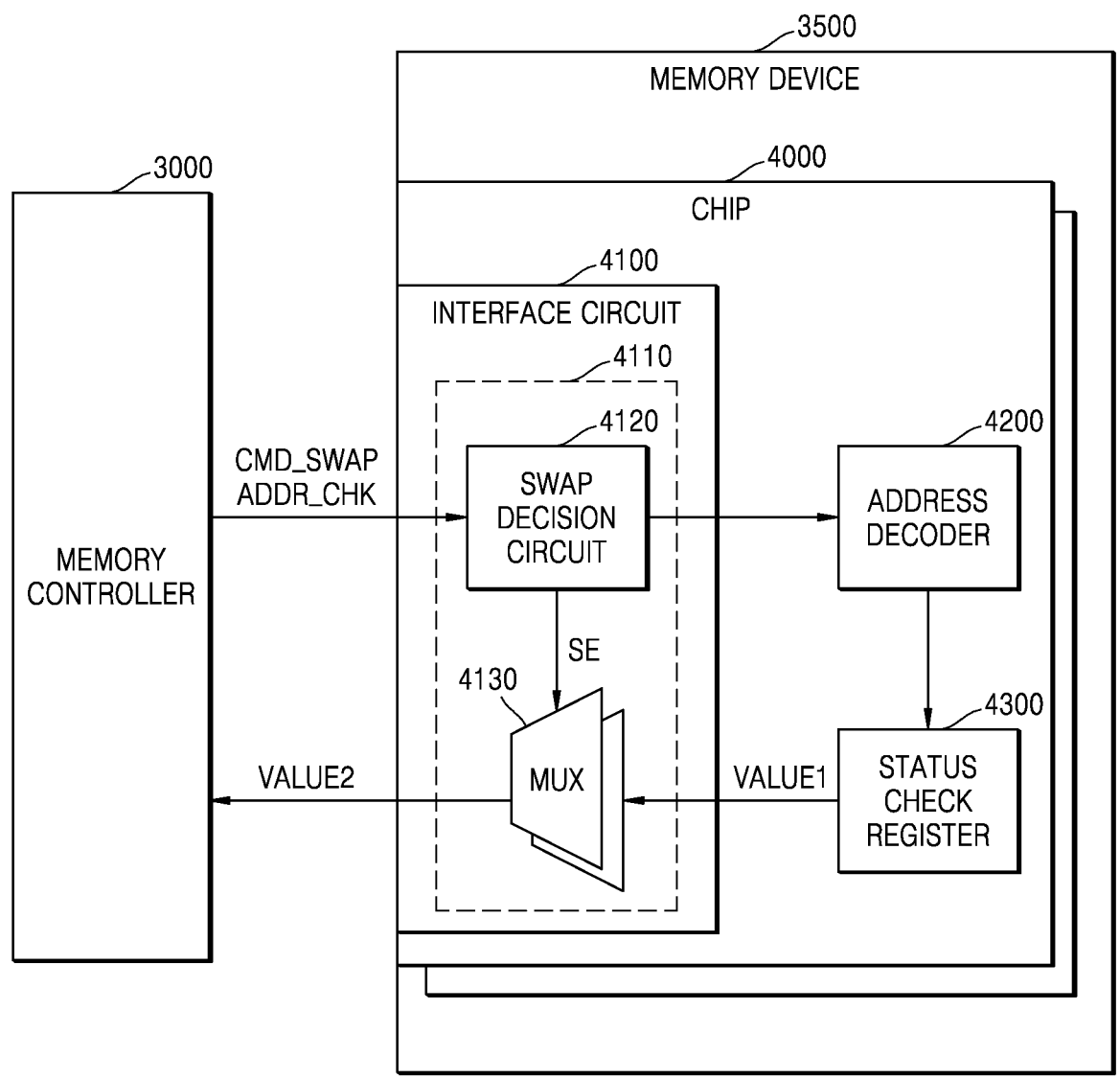
FIG. 10 is a block diagram illustrating a storage device according to an embodiment of the present disclosure.

FIG. 10 illustrates a storage device 30 according to an embodiment of the present disclosure.

Referring to FIG. 10, the storage device 30 may include a memory controller 3000 and a memory device 3500. The memory device 3500 may be a nonvolatile memory device and may include a plurality of chips including a first chip 4000. Each of the plurality of chips may include an interface circuit 4100, an address decoder 4200, and a status check register 4300. Hereinafter, the configuration and operation of the first chip 4000 will be described as an example, but the following description may be applied to the plurality of chips, without limitation thereto.

The storage device 30 may correspond to the storage device 10 of FIG. 1, the memory controller 3000 may correspond to the memory controller 1000 of FIG. 1, and the memory device 3500 may correspond to the memory device 1500 of FIG. 1, and the plurality of chips may correspond to the plurality of chips 2000 of FIG. 1.

In an embodiment, the first chip 4000 may include the interface circuit 4100, the address decoder 4200, and the status check register 4300. The interface circuit 4100 may include a swap circuit 4110 including a swap decision circuit 4120 and a plurality of multiplexers 4130.

As described above, the memory controller 3000 may control a swap operation of the first chip 4000 by transmitting the swap command set SWAP CMD SET to the first chip 4000. As an example, the swap circuit 4110 may generate the swap enable signal SE, swap input data according to the swap enable signal SE and store the swapped input data, and swap output data according to the swap enable signal SE and output the swapped output data.

The memory controller 3000 may determine whether the first chip 4000 is in a swap mode ON state or a swap mode OFF state according to an operation that may be described in greater detail further below. The memory controller 3000 may recognize or confirm the swap mode of the first chip 4000.

The interface circuit 4100 may include a swap circuit 4110, and the swap circuit 4110 may include a swap decision circuit 4120 and a plurality of multiplexers 4130. The swap circuit 4110 may correspond to the swap circuit 400 of FIG. 4, without limitation thereto.

The swap circuit 4110 may receive the swap command CMD_SWAP and a status check address ADDR_CHK, generate the swap enable signal SE according to the status check address ADDR_CHK, and provide the swap enable signal SE to the multiplexers 4130. For convenience of explanation, a command set including the swap command CMD_SWAP and the status check address ADDR_CHK may be referred to as a status check command set. In addition, because the swap command CMD_SWAP precedes the status check address ADDR_CHK, the swap command may be referred to as a status check command.

The swap circuit 4110 may receive the status check command set from the memory controller 3000. The status check command set may be a signal for the memory controller 3000 to recognize the swap mode of the first chip 4000. The status check command set may include the swap command CMD_SWAP and the status check address ADDR_CHK. The set of status check commands may include palindromes. That is, the swap command CMD_SWAP and the status check address ADDR_CHK may each include palindromes. The swap command CMD_SWAP may indicate that an address to be transmitted later is a signal related to the swap mode. The status check address ADDR_CHK may be a signal that controls the first chip 4000 to transmit a specific value to the memory controller 3000.

The swap circuit 4110 may obtain the swap command CMD_SWAP from data received through an input/output pin and transmit data sequentially obtained after obtaining the swap command CMD_SWAP to the address decoder 4200.

The address decoder 4200 may obtain the status check address ADDR_CHK by decoding data received through the swap circuit 4110. The address decoder 4200 may transmit a call to the status check register 4300 including a fixed value.

The status check register 4300 may include the fixed value output as a response to the status check address ADDR_CHK. The fixed value includes a number other than a palindrome, and is not limited to any number. As an example, the fixed value may be a first value VALUE1.

The plurality of multiplexers 4130 may receive the first value VALUE1 and output a second value VALUE2 according to the swap enable signal SE.

The fixed value output from the status check register 4300 may be output as it is or may be swapped. As an example, when the swap enable signal SE is logic high, the multiplexers 4130 may output the second value VALUE2 obtained by swapping the first value VALUE1. As an example, when the swap enable signal SE is logic low, the multiplexers 4130 may output the first value VALUE1 as the second value VALUE2. That is, because the first chip 4000 outputs different values according to the swap mode, the memory controller 3000 may recognize the swap mode of the first chip 4000 according to the second value VALUE2 output from the first chip 4000.

The plurality of multiplexers 4130 may receive data from the first chip 4000 and output data according to the swap enable signal SE of the swap decision circuit 4120.

Although in FIG. 10 it is illustrated that the address decoder 4200 and the status check register 4300 are outside the swap circuit 4110, the present disclosure is not limited thereto, and at least one of the address decoder 4200 and/or the status check register 4300 may be implemented inside the swap circuit 4110 or inside the interface circuit 4100.

Figure 11:
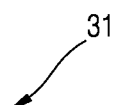
FIG. 11 is a tabular diagram illustrating recognition results according to a location and a swap mode of a memory chip according to an embodiment of the present disclosure.

FIG. 11 illustrates recognition results based on a location and a swap mode of a memory chip according to an embodiment of the present disclosure.

Referring to FIGS. 10 and 11 together, when the memory controller 3000 is disposed on a front side of the double-layer PCB, the first chip 4000 may be disposed on the front side like the memory controller 3000, or a rear side.

The memory controller 3000 may determine whether the first chip 4000 operates normally according to a value received from the first chip 4000 in response to the swap command CMD_SWAP and the status check address ADDR_CHK. For example, the memory controller 3000 may determine whether a swap mode of a chip to operate in the swap mode is ON or a swap mode of the chip to operate in a normal mode is OFF. For example, when receiving the first value VALUE1, which is the fixed value of the status check register 4300 of the first chip 4000 as it is, the memory controller 3000 may determine that the swap mode of the first chip 4000 is normal for that chip, and when receiving a value obtained by swapping the first value VALUE1, the memory controller 3000 may determine that the swap mode of the first chip 4000 is abnormal for that chip.

Hereinafter, description will be made assuming that the memory controller 3000 sends the swap command CMD_SWAP and the status check address ADDR_CHK to the first chip 4000, and the status check register 4300 of the first chip 4000 outputs E0h as a fixed value.

Referring to table 31, when the first chip 4000 is disposed on the front side, input/output pins of the memory controller 3000 and input/output pins of the first chip 4000 may be connected to each other in a forward direction. In this case, the first chip 4000 may normally transmit and receive data with the memory controller 3000 in a swap mode OFF state.

In an embodiment, when the swap mode of the first chip 4000 is ON, the swap enable signal SE output from the swap decision circuit 4120 may have a logic high level. Accordingly, the multiplexers 4130 of the swap circuit 4110 may output 07h as the second value VALUE2 by swapping E0h, which is the first value VALUE1. Because the first chip 4000 and the memory controller 3000 are connected to each other in the forward direction, the memory controller 3000 may receive 07h. Accordingly, the memory controller 3000 may determine the swap mode of the first chip 4000 to be abnormal. Thereafter, the memory controller 3000 may transmit the swap command set CMD_SWAP to turn OFF the swap mode to the first chip 4000.

In an embodiment, when the swap mode of the first chip 4000 is OFF, the swap enable signal SE output from the swap decision circuit 4120 may be at a logic low level. Accordingly, the multiplexers 4130 of the swap circuit 4110 may output the first value E0h as it is as the second value VALUE2. Because the first chip 4000 and the memory controller 3000 are connected to each other in the forward direction, the memory controller 3000 may receive E0h. Accordingly, the memory controller 3000 may determine the swap mode of the first chip 4000 to be normal.

Referring back to table 31, when the first chip 4000 is disposed on the rear side, the input/output pins of the memory controller 3000 and the input/output pins of the first chip 4000 may be connected to each other using a mirror method. In this case, the first chip 4000 may normally transmit/receive data to and from the memory controller 3000 in the swap mode ON state.

In an embodiment, when the swap mode of the first chip 4000 is ON, the swap enable signal SE output from the swap decision circuit 4120 may have a logic high level. Accordingly, the multiplexers 4130 of the swap circuit 4110 may output 07h as the second value VALUE2 by swapping E0h, which is the first value VALUE1. Because the first chip 4000 and the memory controller 3000 are connected to each other using the mirror method, the memory controller 3000 may receive E0h. Accordingly, the memory controller 3000 may determine the swap mode of the first chip 4000 to be normal.

In an embodiment, when the swap mode of the first chip 4000 is OFF, the swap enable signal SE output from the swap decision circuit 4120 may be at a logic low level. Accordingly, the multiplexers 4130 of the swap circuit 4110 may output the first value E0h as it is as the second value VALUE2. Because the first chip 4000 and the memory controller 3000 are connected to each other using a mirror method, the memory controller 3000 may receive 07h. Accordingly, the memory controller 3000 may determine the swap mode of the first chip 4000 to be abnormal. Thereafter, the memory controller 3000 may transmit the swap command set CMD_SWAP to turn OFF the swap mode to the first chip 4000.

Figure 12:
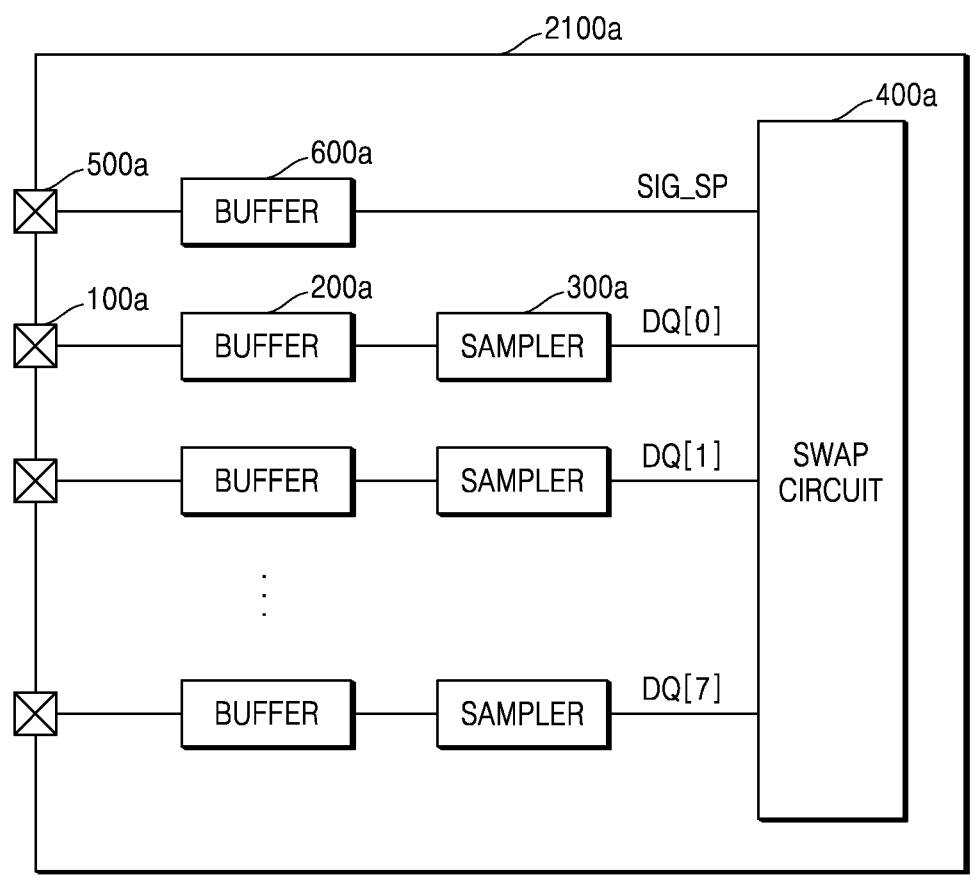
FIG. 12 is a block diagram illustrating an interface circuit according to an embodiment of the present disclosure.

FIG. 12 illustrates an interface circuit 2100a according to an embodiment of the present disclosure.

Referring to FIG. 12, the interface circuit 2100a may include a swap mode pin 500a, a plurality of input/output pins 100a, a plurality of buffers 600a and 200a, a plurality of samplers 300a, and a swap circuit 400a.

The interface circuit 2100a may further include the swap mode pin 500a, compared to the interface circuit 2100 of FIG. 4. Therefore, hereinafter, redundant descriptions with those provided with reference to FIG. 4 may be omitted.

The swap mode pin 500a may receive a swap pin signal SIG_SP indicating a swap operation of the interface circuit 2100a from the outside. The buffer 600a may provide the swap pin signal SIG_SP received by the swap mode pin 500a to the swap circuit 400a.

Because the interface circuit 2100a includes the swap mode pin 500a, a chip including the interface circuit 2100a may operate in a pin-type swap mode. That is, the interface circuit 2100a may output data as it is or may swap and output the data according to the swap pin signal SIG_SP received through the swap mode pin 500a.

Figure 13:
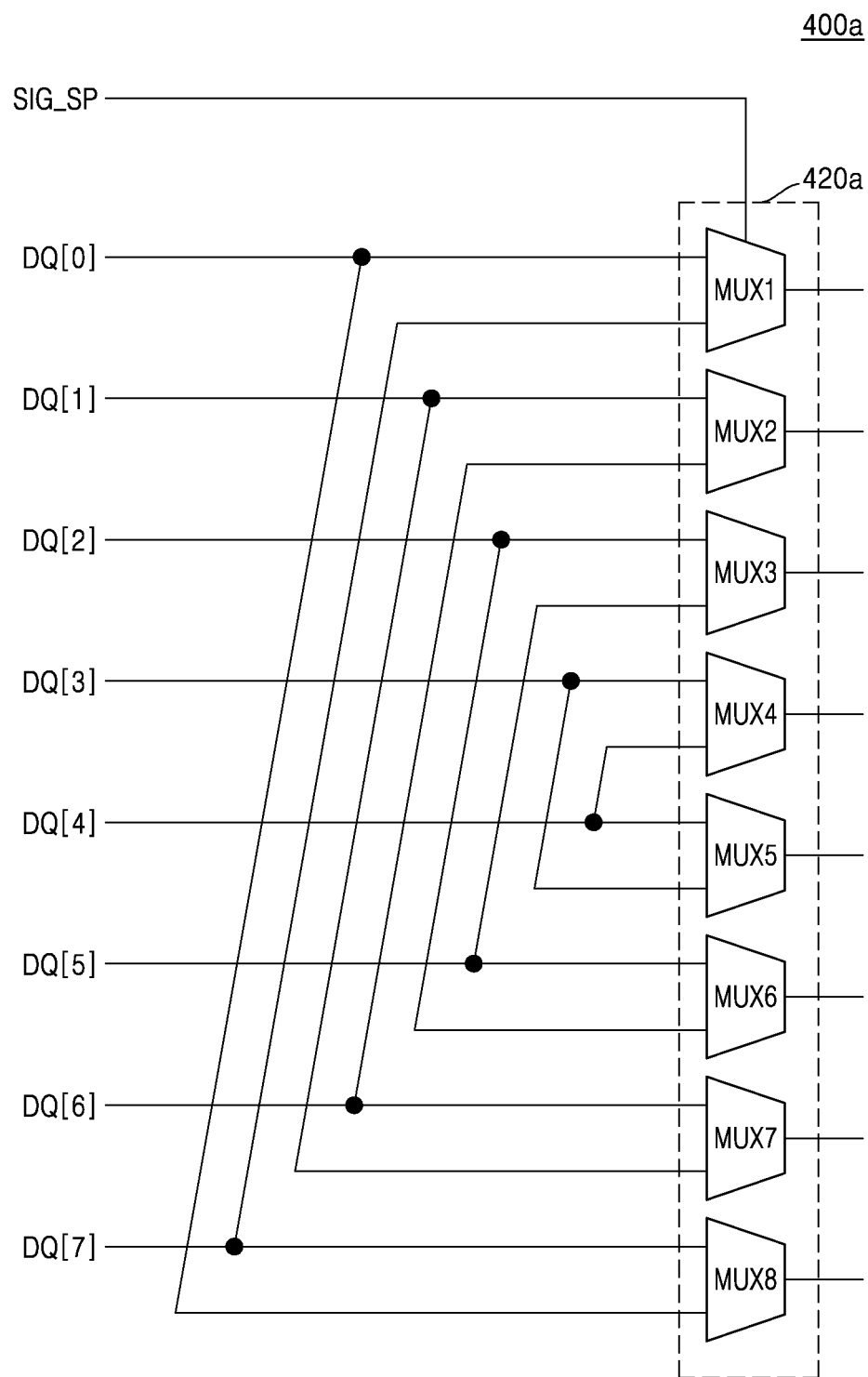
FIG. 13 is a circuit diagram illustrating a swap circuit according to an embodiment of the present disclosure.

FIG. 13 illustrates the swap circuit 400a according to an embodiment of the present disclosure.

Referring to FIG. 13, the swap circuit 400a may include a plurality of multiplexers 420a that output data according to the swap pin signal SIG_SP.

Compared to the swap circuit 400 of FIG. 5, the swap circuit 400a may further include the swap pin signal SIG_SP and may not include the swap decision circuit 410 and the swap enable signal SE. Therefore, hereinafter, substantially redundant descriptions to those provided with reference to FIG. 5 may be omitted.

The swap pin signal SIG_SP may serve as a selection signal of each of the multiplexers 420a. As an example, each of the multiplexers 420a may output data as it is or may swap and output the data according to a logic level of the swap pin signal SIG_SP.

For example, when the swap pin signal SIG_SP is at a first logic level (e.g., logic low), the first to eighth multiplexers 410a may respectively output the first to eighth data signals DQ[0]-DQ[7]. When the swap pin signal SIG_SP is at a second logic level (e.g., logic high), the first to the eighth multiplexers 410a may respectively output the eighth data signal to the first data signal DQ[7] to DQ[0].

A chip including a swap mode pin (for example, 500a of FIG. 12) may operate in a command-type swap mode as well as a pin-type swap mode. In addition, the chip may perform a swap operation by changing between the pin-type swap mode and the command-type swap mode. Detailed descriptions in this regard may be described below.

In an alternate embodiment, the signal lines corresponding to the data signal DQ of FIG. 13 may be rearranged, top to bottom with respect to the circuit diagram, from DQ[0], DQ[1], DQ[2], DQ[3], DQ[4], DQ[5], DQ[6], DQ[7], into DQ[0], DQ[7], DQ[1], DQ[6], DQ[2], DQ[5], DQ[3], DQ[4], for example. This alternate embodiment may provide substantially same length conductive paths for the data signals input to the multiplexers regardless of swap mode.

Figure 14:
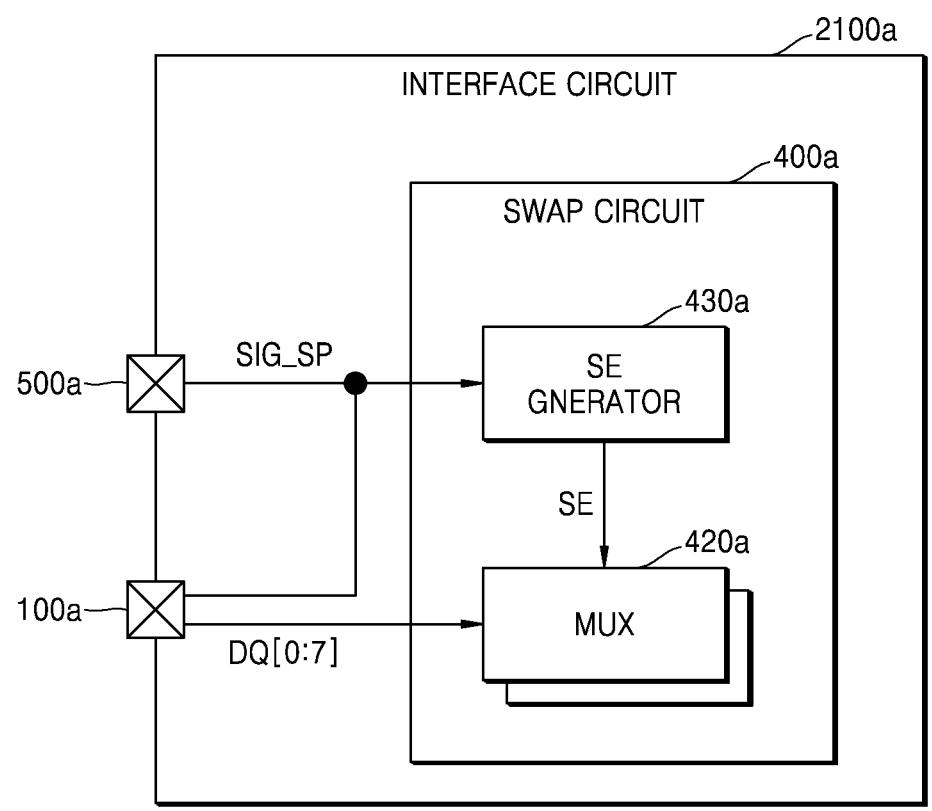
FIG. 14 is a block diagram illustrating an interface circuit according to an embodiment of the present disclosure.

FIG. 14 illustrates an interface circuit according to an embodiment of the present disclosure.

Referring to FIG. 14, the interface circuit 2100a may select an operation mode of a chip including the interface circuit 2100a as one of a pin-type swap mode and a command-type swap mode. That is, the swap circuit 400a may selectively perform the operation of the swap circuit 400 of FIGS. 1 to 9 and the operation of the swap circuit 400a of FIGS. 12 and 13 described above. Therefore, hereinafter, redundant descriptions with those provided with respect to operations of the swap circuits 400 and 400a described above will be omitted.

The swap circuit 400a may include a swap enable signal generator 430a and a plurality of multiplexers 420a. The swap circuit 400a may receive the swap pin signal SIG_SP through the swap mode pin 500a, receive a data signal DQ[0:7] through the plurality of input/output pins 100a, and receive the swap command CMD_SWAP and the swap address ADDR_SWAP from the data signal DQ[0:7]).

The swap enable signal generator 430a may generate the swap enable signal SE using the swap pin signal SIG_SP, the swap command CMD_SWAP, and the swap address ADDR_SWAP. The swap enable signal generator 430a may transmit the swap enable signal SE to each of the multiplexers 420a as a selection signal. The plurality of multiplexers 420a may output the data signal DQ[0:7] as it is or may swap and output the data signal DQ[0:7] based on the swap enable signal SE. In this case, the data signal DQ[0:7] may include the data after the swap mode is set.

Figure 15:
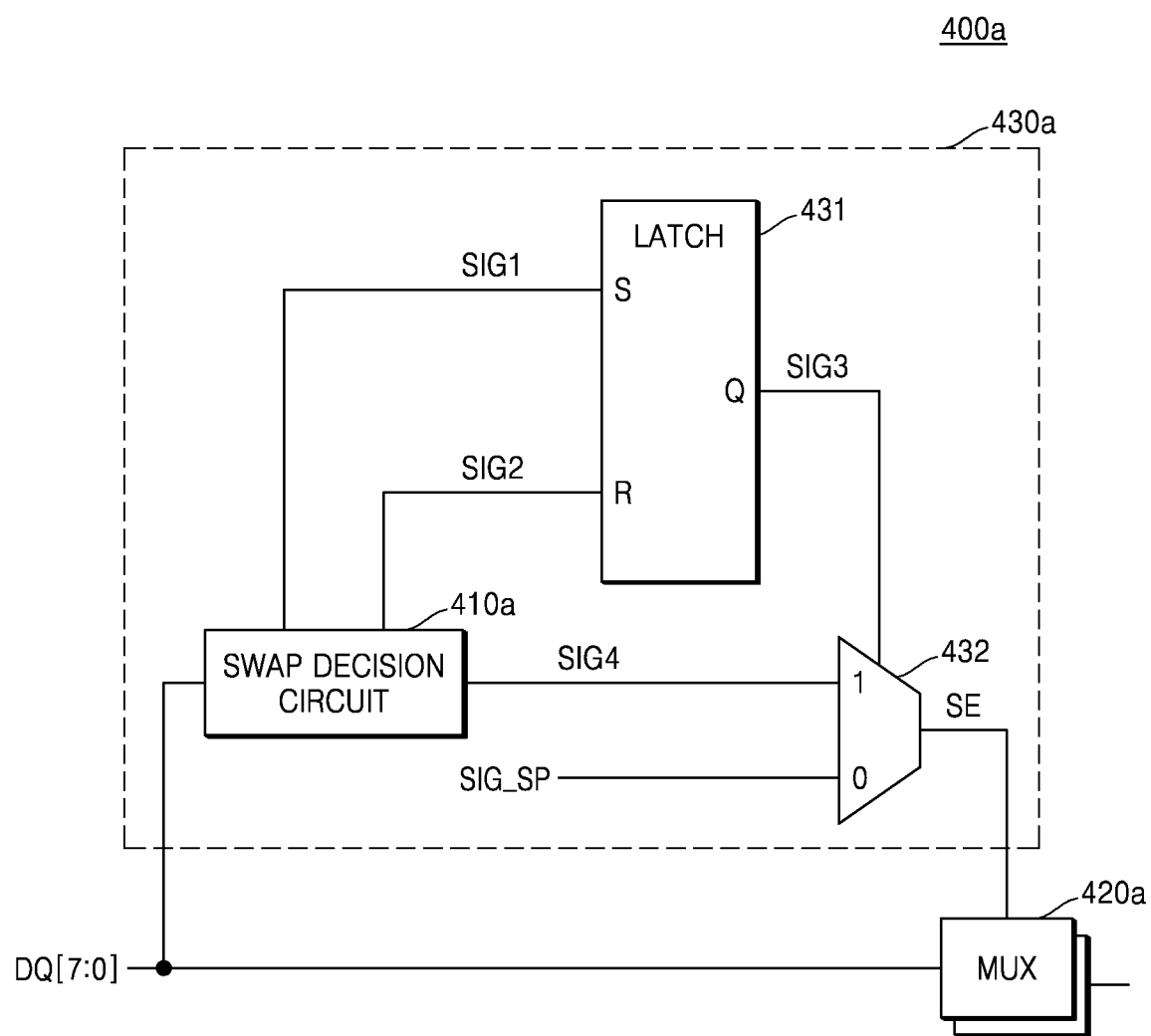
FIG. 15 is a circuit diagram illustrating a swap enable signal generator according to an embodiment of the present disclosure.

FIG. 15 illustrates a swap enable signal generator 430a according to an embodiment of the present disclosure.

Referring to FIG. 15, the swap enable signal generator 430a may include a swap decision circuit 410a, an SR latch 431, and a multiplexer 432.

The swap decision circuit 410a may obtain a command and an address from the data signal DQ[0:7]. As an example, the swap command CMD_SWAP and the swap address ADDR_SWAP may be obtained. The swap decision circuit 410a may obtain a swap command set SWAP CMD SET.

When obtaining the swap command CMD_SWAP and the swap address ADDR_SWAP from the swap command set SWAP CMD SET, the swap decision circuit 410a may set a logic level of the first signal SIG1 to logic high, and when not obtaining the swap command CMD_SWAP and the swap address ADDR_SWAP, the swap decision circuit 410a may set the logic level of the first signal SIG1 to logic low. At this time, a specific type of swap address ADDR_SWAP need not be obtained.

As an example, when the data signal DQ[0:7] includes the swap command CMD_SWAP and the swap address ADDR_SWAP indicating the command-type swap mode, the swap decision circuit 410a may set the logic level of the first signal SIG1 to logic high. As an example, when the data signal DQ[0:7] includes a general read command and an address, the swap decision circuit 410a may set the logic level of the first signal SIG1 to logic low.

When obtaining at least one of a power-off command, a reset command, and a command indicating a pin-type swap mode from the data signal DQ[0:7], the swap decision circuit 410a may set a logic level of the second signal SIG2 to logic high, and in other cases, the swap decision circuit 410a may set the logic level of the second signal SIG2 to logic low. Meanwhile, as a command acquired by the swap decision circuit 410a to control the logic level of the second signal SIG2, the above-described commands are examples and are not limited thereto.

The swap decision circuit 410a may generate a fourth signal SIG4 by performing the operation of the swap decision circuit 410a of FIG. 5. As an example, when obtaining the swap command CMD_SWAP from the input data signal DQ[0:7] and then sequentially obtaining the swap address ADDR_SWAP, the swap decision circuit 410a may determine a logic level of the fourth signal SIG4 according to the swap address ADDR_SWAP. As an example, when the swap address ADDR_SWAP indicates a swap mode ON state of a memory chip, the swap decision circuit 410a may set the logic level of the fourth signal SIG4 to logic high, and when the swap address ADDR_SWAP indicates a swap mode OFF state of the memory chip, the swap decision circuit 410a may set the logic level of the fourth signal SIG4 to logic low.

The SR latch 431 may include a set input terminal S receiving the first signal SIG1 as a set signal, a reset input terminal R receiving the second signal SIG2 as a reset signal, and an output terminal outputting the third signal SIG3.

As an example, the SR latch 431 may output the third signal SIG3 of a logic high level in response to logic high of the first signal SIG1 and logic low of the second signal SIG2. The SR latch 431 may output the third signal SIG3 of a logic low level in response to logic low of the first signal SIG1 and logic high of the second signal SIG2.

The multiplexer 432 may receive the third signal SIG3 and a swap pin signal SIG_SP, and may output the swap enable signal SE according to the third signal SIG3. The third signal SIG3 may correspond to the swap enable signal SE output from the swap decision circuit 410 of FIG. 2.

As an example, when the third signal SIG3 is at a logic high level, the multiplexer 432 may output the fourth signal SIG4 as the swap enable signal SE. When the third signal SIG3 is at a logic low level, the multiplexer 432 may output the swap pin signal SIG_SP as the swap enable signal SE.

Accordingly, the swap circuit 400a may swap data by operating in one of the pin-type swap mode and the command-type swap mode. Meanwhile, in FIG. 15, a swap operation on input data has been described, but the present embodiment may be similarly applied to output data.

Figure 16:
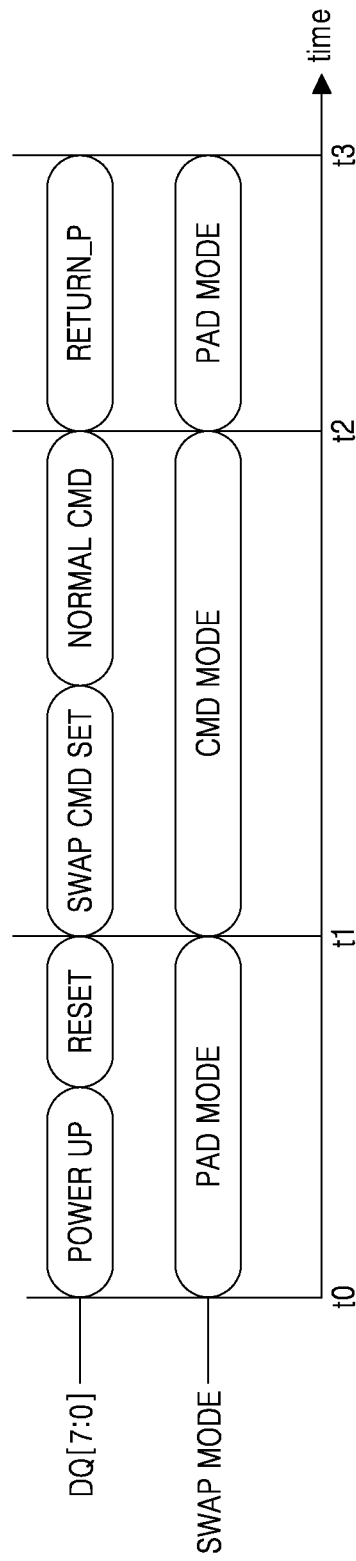
FIG. 16 is a timing diagram illustrating a swap mode of a memory chip according to an embodiment of the present disclosure.

FIG. 16 illustrates a swap mode of a memory chip according to an embodiment of the present disclosure.

Referring to FIGS. 14 and 16 together, the interface circuit 2100a may receive the power-up command PWRUP and a reset command through the plurality of input/output pins 100a at a time t0. Until a command set for turning on a command-type swap mode is received, a default swap mode of the chip may be a pin-type swap mode, but is not limited thereto. Accordingly, in a first period t0 to t1, the swap circuit 400a may operate in the pin-type swap mode.

At time t1, the interface circuit 2100a may receive the swap command set SWAP CMD SET through the input/output pins 100a. As an example, the swap command set SWAP CMD SET may include the swap command CMD_SWAP and the swap address ADDR_SWAP for turning on the command-type swap mode. Thereafter, the interface circuit 2100a may receive a normal command NORMAL CMD through the input/output pins 100a. Accordingly, in a second period t1 to t2, the swap circuit 400a may operate in the command-type swap mode.

At time t2, the interface circuit 2100a may receive a command RETURN_P to return to the pin-type swap mode through the input/output pins 100a. As an example, the command RETURN_P to return to the pin-type swap mode may include the swap command SWAP_CMD, and include a palindrome. Accordingly, in a third period t2 to t3, the swap circuit 400a may operate in the pin-type swap mode.

Figure 17:
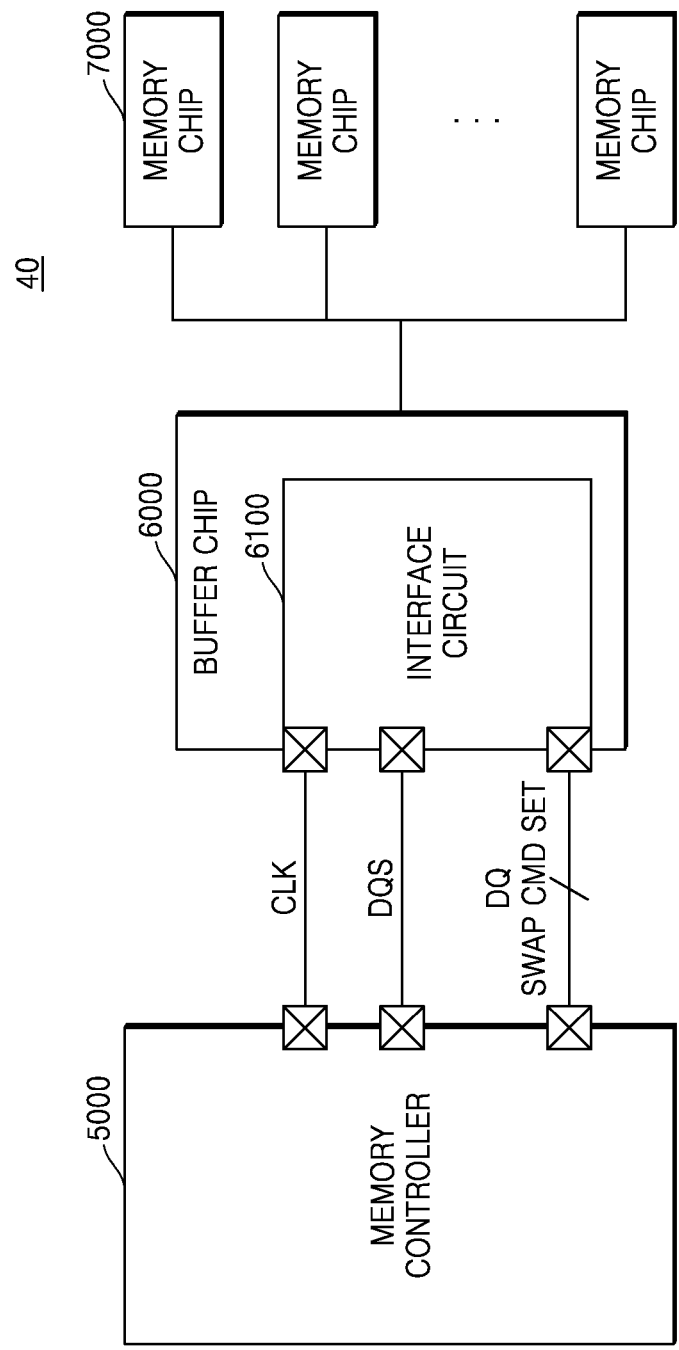
FIG. 17 is a block diagram illustrating a storage device according to an embodiment of the present disclosure.

FIG. 17 illustrates a storage device 40 according to an embodiment of the present disclosure.

Referring to FIG. 17, the storage device 40 may include a memory controller 5000, a buffer chip 6000, and a plurality of memory chips 7000.

The buffer chip 6000 may be located between the memory controller 5000 and the plurality of memory chips 7000, and parallelize and transmit the data signal DQ received from the memory controller 5000 to the plurality of memory chips 7000, and serialize and transmit the data signal DQ received from the plurality of memory chips 7000 to the memory controller 5000.

The buffer chip 6000 may include an interface circuit 6100, and the interface circuit 6100 may perform operations of the interface circuits 2100, 4100, and 2100a of FIGS. 1 to 15 described above. As an example, the memory controller 5000 may turn ON or OFF a swap mode of the buffer chip 6000 and recognize the swap mode of the buffer chip 6000.

Because the plurality of memory chips 7000 are connected to the buffer chip 6000, the memory controller 5000 may control a swap mode of the connected memory chips 7000 at once by controlling a swap mode of one buffer chip 6000.

In addition, even when the plurality of memory chips 7000 do not support a swap mode change function, an effect of the plurality of memory chips 7000 performing a swap operation may be obtained through the operation of the buffer chip 6000.

Figure 18:
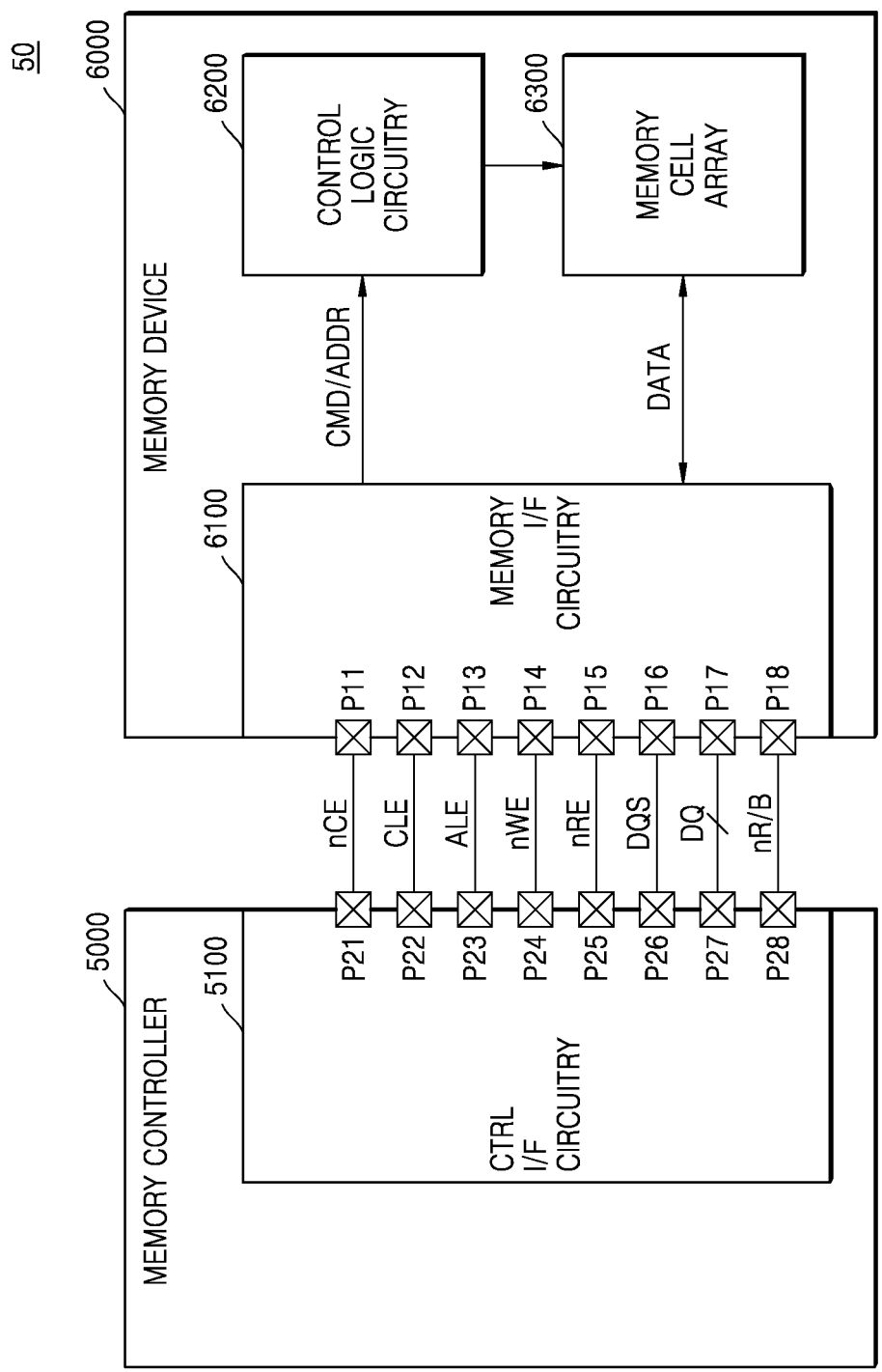
FIG. 18 is a block diagram of a memory system according to an embodiment of the present disclosure.

FIG. 18 illustrates a memory system 50 according to an embodiment.

Referring to FIG. 18, the memory system 50 may include a memory device 9000 and a memory controller 8000.

The memory device 9000 may correspond to the memory device 1500 of FIG. 1 or the memory device 3500 of FIG. 10. The memory controller 8000 may correspond to one of the memory controller 1000 of FIG. 1, the memory controller 3000 of FIG. 10, and the memory controller 5000 of FIG. 17.

The memory device 9000 may include first to eighth pins P11 to P18, a memory interface circuitry 9100, a control logic circuitry 9200, and a memory cell array 9300.

The memory interface circuitry 9100 may receive a chip enable signal nCE from the memory controller 8000 through the first pin P11. The memory interface circuitry 9100 may transmit and receive signals to and from the memory controller 8000 through the second to eighth pins P12 to P18 in response to the chip enable signal nCE. For example, when the chip enable signal nCE is in an enable state (e.g., a low level), the memory interface circuitry 9100 may transmit and receive signals to and from the memory controller 8000 through the second to eighth pins P12 to P18.

The memory interface circuitry 9100 may receive a command latch enable signal CLE, an address latch enable signal ALE, and a write enable signal nWE from the memory controller 8000 through the second to fourth pins P12 to P14. The memory interface circuitry 9100 may receive a data signal DQ from the memory controller 8000 through the seventh pin P17 or transmit the data signal DQ to the memory controller 8000. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s).

The memory interface circuitry 9100 may obtain the command CMD from the data signal DQ, which is received in an enable section (e.g., a high-level state) of the command latch enable signal CLE based on toggle time points of the write enable signal nWE. The memory interface circuitry 9100 may obtain the address ADDR from the data signal DQ, which is received in an enable section (e.g., a high-level state) of the address latch enable signal ALE based on the toggle time points of the write enable signal nWE.

In an example embodiment, the write enable signal nWE may be maintained at a static state (e.g., a high level or a low level) and toggle between the high level and the low level.

For example, the write enable signal nWE may toggle in a section in which the command CMD or the address ADDR is transmitted. Thus, the memory interface circuitry 9100 may obtain the command CMD or the address ADDR based on toggle time points of the write enable signal nWE.

The memory interface circuitry 9100 may receive a read enable signal nRE from the memory controller 8000 through the fifth pin P15. The memory interface circuitry 9100 may receive a data strobe signal DQS from the memory controller 8000 through the sixth pin P16 or transmit the data strobe signal DQS to the memory controller 8000.

In a data (DATA) output operation of the memory device 9000, the memory interface circuitry 9100 may receive the read enable signal nRE, which toggles through the fifth pin P15, before outputting the data DATA. The memory interface circuitry 9100 may generate the data strobe signal DQS, which toggles based on the toggling of the read enable signal nRE. For example, the memory interface circuitry 9100 may generate a data strobe signal DQS, which starts toggling after a predetermined delay (e.g., tDQSRE), based on a toggling start time of the read enable signal nRE. The memory interface circuitry 9100 may transmit the data signal DQ including the data DATA based on a toggle time point of the data strobe signal DQS. Thus, the data DATA may be aligned with the toggle time point of the data strobe signal DQS and transmitted to the memory controller 8000.

In a data (DATA) input operation of the memory device 9000, when the data signal DQ including the data DATA is received from the memory controller 8000, the memory interface circuitry 9100 may receive the data strobe signal DQS, which toggles, along with the data DATA from the memory controller 8000. The memory interface circuitry 9100 may obtain the data DATA from the data signal DQ based on toggle time points of the data strobe signal DQS. For example, the memory interface circuitry 9100 may sample the data signal DQ at rising and falling edges of the data strobe signal DQS and obtain the data DATA.

The memory interface circuitry 9100 may transmit a ready/busy output signal nR/B to the memory controller 8000 through the eighth pin P18. The memory interface circuitry 9100 may transmit state information of the memory device 9000 through the ready/busy output signal nR/B to the memory controller 8000. When the memory device 9000 is in a busy state (i.e., when operations are being performed in the memory device 9000), the memory interface circuitry 9100 may transmit a ready/busy output signal nR/B indicating the busy state to the memory controller 8000. When the memory device 9000 is in a ready state (i.e., when operations are not performed or completed in the memory device 9000), the memory interface circuitry 9100 may transmit a ready/busy output signal nR/B indicating the ready state to the memory controller 8000. For example, while the memory device 9000 is reading data DATA from the memory cell array 9300 in response to a page read command, the memory interface circuitry 9100 may transmit a ready/busy output signal nR/B indicating a busy state (e.g., a low level) to the memory controller 8000. For example, while the memory device 9000 is programming data DATA to the memory cell array 9300 in response to a program command, the memory interface circuitry 9100 may transmit a ready/busy output signal nR/B indicating the busy state to the memory controller 8000.

The control logic circuitry 9200 may control operations of the memory device 9000. The control logic circuitry 9200 may receive the command/address CMD/ADDR obtained from the memory interface circuitry 9100. The control logic circuitry 9200 may generate control signals for controlling other components of the memory device 9000 in response to the received command/address CMD/ADDR. For example, the control logic circuitry 9200 may generate various control signals for programming data DATA to the memory cell array 9300 or reading the data DATA from the memory cell array 9300.

The memory cell array 9300 may store the data DATA obtained from the memory interface circuitry 9100, via the control of the control logic circuitry 9200. The memory cell array 9300 may output the stored data DATA to the memory interface circuitry 9100 via the control of the control logic circuitry 9200.

The memory cell array 9300 may include a plurality of memory cells. For example, the plurality of memory cells may be flash memory cells. However, the present disclosure is not limited thereto, and the memory cells may be RRAM cells, FRAM cells, PRAM cells, thyristor RAM (TRAM) cells, or MRAM cells. Hereinafter, an embodiment in which the memory cells are NAND flash memory cells will mainly be described.

The memory controller 8000 may include first to eighth pins P21 to P28 and a controller interface circuitry 8100. The first to eighth pins P21 to P28 may respectively correspond to the first to eighth pins P11 to P18 of the memory device 9000.

The controller interface circuitry 8100 may transmit a chip enable signal nCE to the memory device 9000 through the first pin P21. The controller interface circuitry 8100 may transmit and receive signals to and from the memory device 9000, which is selected by the chip enable signal nCE, through the second to eighth pins P22 to P28.

The controller interface circuitry 8100 may transmit the command latch enable signal CLE, the address latch enable signal ALE, and the write enable signal nWE to the memory device 9000 through the second to fourth pins P22 to P24. The controller interface circuitry 8100 may transmit or receive the data signal DQ to and from the memory device 9000 through the seventh pin P27.

The controller interface circuitry 8100 may transmit the data signal DQ including the command CMD or the address ADDR to the memory device 9000 along with the write enable signal nWE, which toggles. The controller interface circuitry 8100 may transmit the data signal DQ including the command CMD to the memory device 9000 by transmitting a command latch enable signal CLE having an enable state. Also, the controller interface circuitry 8100 may transmit the data signal DQ including the address ADDR to the memory device 9000 by transmitting an address latch enable signal ALE having an enable state.

The controller interface circuitry 8100 may transmit the read enable signal nRE to the memory device 9000 through the fifth pin P25. The controller interface circuitry 8100 may receive or transmit the data strobe signal DQS from or to the memory device 9000 through the sixth pin P26.

In a data (DATA) output operation of the memory device 9000, the controller interface circuitry 8100 may generate a read enable signal nRE, which toggles, and transmit the read enable signal nRE to the memory device 9000. For example, before outputting data DATA, the controller interface circuitry 8100 may generate a read enable signal nRE, which is changed from a static state (e.g., a high level or a low level) to a toggling state. Thus, the memory device 9000 may generate a data strobe signal DQS, which toggles, based on the read enable signal nRE. The controller interface circuitry 8100 may receive the data signal DQ including the data DATA along with the data strobe signal DQS, which toggles, from the memory device 9000. The controller interface circuitry 8100 may obtain the data DATA from the data signal DQ based on a toggle time point of the data strobe signal DQS.

In a data (DATA) input operation of the memory device 9000, the controller interface circuitry 8100 may generate a data strobe signal DQS, which toggles. For example, before transmitting data DATA, the controller interface circuitry 8100 may generate a data strobe signal DQS, which is changed from a static state (e.g., a high level or a low level) to a toggling state. The controller interface circuitry 8100 may transmit the data signal DQ including the data DATA to the memory device 9000 based on toggle time points of the data strobe signal DQS.

The controller interface circuitry 8100 may receive a ready/busy output signal nR/B from the memory device 9000 through the eighth pin P28. The controller interface circuitry 8100 may determine state information of the memory device 9000 based on the ready/busy output signal nR/B.

While the present disclosure has been particularly shown and described by way of example with reference to embodiments thereof, it will be understood that various changes in form and details may be made therein by those of ordinary skill in the pertinent art without departing from the spirit and scope of the following claims.

What is claimed is:

1. A memory chip comprising:
    a plurality of pins; and
    an interface circuit configured to receive a swap command set from a memory controller through the plurality of pins, obtain a swap command and a swap address from the swap command set, generate a swap enable signal based on the swap command and the swap address, and swap and output a data signal according to the swap enable signal,
    wherein each of the swap command and the swap address comprises a palindrome.

2. The memory chip of claim 1, wherein the interface circuit is configured to, when obtaining a first data signal comprising a palindrome and then sequentially obtaining a second data signal comprising a palindrome from the swap command set, determine the first data signal as the swap command, and determine the second data signal as the swap address.

3. The memory chip of claim 2, wherein the swap command sets up the interface circuit for a swap operation of the memory chip, and
    wherein the swap address determines whether to swap the data signal.

4. The memory chip of claim 3, wherein the interface circuit is configured to determine a logic level of the swap enable signal based on the swap address.

5. The memory chip of claim 1, wherein the swap command and the swap address are obtained between a time when the memory chip receives a power up command and a time when the memory chip receives a reset command or obtained after the time when the memory chip receives the reset command.

6. The memory chip of claim 1, wherein the interface circuit comprises:
    a plurality of multiplexers respectively connected to the plurality of pins to receive the data signal and the swap command set; and
    a swap decision circuit configured to receive the swap command set, generate the swap enable signal based on the swap address, and provide the swap enable signal to the plurality of multiplexers as a selection signal, and
    wherein data output through the plurality of multiplexers is forward data or swapped data.

7. The memory chip of claim 6, wherein the plurality of pins comprise first and second pins,
    wherein the data signal comprises first and second signals,
    wherein the plurality of multiplexers comprise first and second multiplexers,
    wherein the first multiplexer is connected to first and second pins to receive first and second signals,
    wherein the second multiplexer is connected to the second and first pins to receive the second and first signals, and
    wherein the first and second multiplexers are configured to output the first and second signals, respectively, or output the second and first signals, respectively, according to the swap enable signal.

8. An operating method of a memory chip comprising a plurality of pins, the operating method comprising:
    receiving a swap command set through the plurality of pins;
    obtaining a swap command and a swap address from the swap command set;
    generating a swap enable signal based on the swap command and the swap address; and
    swapping and outputting a data signal through the plurality of pins according to the swap enable signal,
    wherein the plurality of pins comprises a swap mode pin,
    wherein the receiving of the swap command set comprises receiving a first signal determining a swap mode of the memory chip through the swap mode pin.

9. The operating method of claim 8, wherein the generating of the swap enable signal comprises generating the swap enable signal according to the swap address when the swap address indicates a command-type swap mode of the memory chip based on the swap command, the swap address, and the first signal; and
    generating the first signal as the swap enable signal when the swap address does not indicate the command-type swap mode of the memory chip.

10. The operating method of claim 9, wherein the generating of the first signal as the swap enable signal comprises:
    generating the first signal as the swap enable signal in response to the swap address indicating any one of a power-off operation, a reset operation, and a pin-type swap mode operation of the memory chip.

* * * * *